United States Patent [19]

Helt et al.

[11] Patent Number: 4,720,981
[45] Date of Patent: Jan. 26, 1988

[54] COOLING OF AIR CONDITIONING CONTROL ELECTRONICS

[75] Inventors: Robert W. Helt, Tyler; George N. Sawyer, Flint, both of Tex.

[73] Assignee: American Standard Inc., New York, N.Y.

[21] Appl. No.: 946,452

[22] Filed: Dec. 23, 1986

[51] Int. Cl.⁴ .............................................. F25B 41/00
[52] U.S. Cl. ..................................... 62/113; 62/228.4; 62/513; 165/80.4; 361/382
[58] Field of Search .............. 62/113, 513, 505, 228.4; 236/49; 417/366, 367; 361/381, 382, 385, 386, 389, 388; 165/80.4, 171; 357/81, 82

[56] References Cited

U.S. PATENT DOCUMENTS

| | | | |
|---|---|---|---|
| 1,960,576 | 5/1934 | Dennedy | 62/113 |
| 2,643,282 | 6/1953 | Greene | 174/15 |
| 3,449,922 | 6/1969 | Ruff et al. | 62/505 X |
| 4,029,141 | 6/1977 | Ferrari et al. | 165/80 |
| 4,079,410 | 3/1978 | Schierz | 165/80.4 X |
| 4,084,406 | 4/1978 | Brenneman | 62/211 |
| 4,120,019 | 10/1978 | Arii et al. | 361/381 X |
| 4,142,577 | 3/1979 | Klein | 165/80 |

OTHER PUBLICATIONS

Nutter et al., *IBM Technical Disclosure Bulletin*, vol. 22, No. 8A, Jan. 1980, "Thermally Enchanced Cold Plate", 165-171.

*Primary Examiner*—Harry B. Tanner
*Attorney, Agent, or Firm*—William J. Beres; Robert J. Harter; Carl M. Lewis

[57] ABSTRACT

A residential heat pump installation includes a variable speed reciprocating compressor. The compressor speed control components, which include an inverter, are cooled by diverting the refrigerant liquid line into the closed controls compartment of the outdoor cabinet section and by passing the liquid line through a block of material therein upon which the compressor speed control components are mounted. The heat generated by the speed control components is transferred through the block of material and ultimately into the liquid refrigerant which is pumped through the liquid line by the operation of the compressor. Heat generated in the controls compartment is therefore removed from the compartment by system refrigerant in an manner which does not, to any significant degree, adversely affect the overall operation and efficiency of the system.

20 Claims, 7 Drawing Figures

COOLING OF AIR CONDITIONING CONTROL ELECTRONICS

FIELD OF THE INVENTION

This invention relates to the cooling of heat producing electrical/electronic control components in an air conditioning system. More specifically, the present invention relates to the cooling, by system refrigerant, of an inverter and related power components which are employed in the control of a true variable speed compressor in a residential heat pump system.

BACKGROUND OF THE INVENTION

The use of true variable speed compressors has historically been limited to extremely large and expensive commercial air conditioning and refrigeration systems wherein a centrifugal compressor is employed. While variable speed compressors have previously been employed in large air conditioning systems, the use of variable speed reciprocating compressors in smaller systems, such as in heat pumps for residential heating and cooling applications, has not been accepted until recently due to the relative cost of such compressors and their ancillary control equipment and the historical availability of inexpensive power. In general, the efficiencies offered by the use of a true variable speed compressor, in which compressor speed and therefore system capacity is precisely controlled over a continuous range in accordance with the actual demand on the system, have not been sufficiently attractive to offset initial cost considerations in the residential market where profit margins are not so high and wherein the consumer is more easily swayed by the initial cost of a system.

Many less than entirely successful attempts have been made to obtain the benefits associated with the employment of a true variable speed compressor in residential and light commercial air conditioning applications, without actually doing so, by providing for multiple compressor installations which offer discrete capacity steps or by the provision of multi-speed compressors which likewise offer stepped heating or cooling capacities. The response of such systems to the loads they experience, being stepwise rather than continuous, is extremely coarse and inefficient as compared to the response available when a variable speed compressor is employed.

Conditions are changing such that the employment of a true variable speed compressor in certain residential air conditioning applications is becoming more attractive, particularly as consumers become more educated and interested in purchasing energy efficient products. This is especially true of relatively high price products, such as central air conditioning systems, which inherently use large quantities of energy.

Although the use, per se, of a variable speed compressor in air conditioning applications does not present overwhelming technical difficulties, the use of such compressors in small capacity residential systems does present some unique problems which do not exist or which are easily resolved in larger air conditioning systems. Among these is the problem of heat generation by the electronic and electrical components by which the speed of the compressor is controlled.

Residential air conditioners and heat pumps are generally comprised of indoor and outdoor sections. The outdoor section typically houses a compressor, a fan, a heat exchanger, various refrigerant piping/plumbing connections as well as the system controls. All of these components are housed in a relatively small cabinet which sits adjacent the residence or structure and which is exposed, year-round, to outdoor temperature and weather conditions.

Due to the need to protect the control components from the elements, they are generally found in a sealed or entirely closed-in portion of the outdoor section cabinet. The lack of ventilation of this control space exacerbates the problem of cooling the controls therein, particularly when ambient temperatures exceed 100° F. which is a not uncommon condition. Further, if it is decided to cool the controls in such a space with air, the air to be used will almost of necessity be outdoor ambient air. In such cases, elaborate provision must be made to account for the moisture, pollutants, salt and the like which is typically found in the atmosphere and the interaction of which with electronic controls tends to cause deterioration or failure of the controls. It will therefore be appreciated that the use of components such as an inverter to control the speed of a compressor in a residential or light commercial air conditioning application presents some unique and significant difficulties from the standpoint of cooling system controls in a space subject to a large heat load.

Electrical and electronic heat producing components are previously known to have been cooled by immersion in or heat transfer with a liquid coolant. U.S. Pat. Nos. 4,029,141 and 4,144,577 both teach somewhat generic and dedicated cooling structures through which a fluid coolant is pumped to cool particular types of heat producing power components. U.S. Pat. No. 2,643,282, on the other hand, teaches a refrigeration circuit dedicated to the evaporative cooling, by immersion, of electrical components which are otherwise unrelated to the refrigeration system by which such cooling is accomplished.

U.S. Pat. No. 4,084,406 teaches a large centrifugal chiller in which a portion of the refrigerant flowing within the chiller is diverted from the main refrigerant flow path into a branch refrigerant line and into a sealed box containing silicon controlled rectifiers (SCR's). The box fills with liquid refrigerant, immersing the SCR's, until an overflow condition is reached at which time the excess refrigerant flows out of the box and is directed back to a refrigerant sump.

Neither the quantity of refrigerant employed nor cost considerations nor the physical make-up of a residential air conditioning system allow for the direct immersion of system control components in refrigerant for cooling purposes. Nor do space considerations and/or refrigerant amounts in such systems allow for the employment of discrete or independent subsystems dedicated to the cooling of system control components. Therefore, the need exists for both a viable method and apparatus by which the heat generated in compressor speed control components in light commercial/rooftop or residential central air conditioning systems is removed from the space in which the components are located before the employment of a variable speed compressor in these smaller systems becomes practical.

SUMMARY OF THE PRESENT INVENTION

It is an object of the present invention to provide for the cooling of electronic control components in an air conditioning system.

It is a further object of the present invention to cool the power components which control the speed of a variable speed reciprocating compressor in a light commercial or residential air conditioning system with system refrigerant.

It is another object of the present invention to cool an inverter and related controls located in the closed controls compartment in the outdoor section of a residential air conditioning system and to remove the heat generated by the inverter and associated components from the compartment by transferring such heat to refrigerant pumped through the compartment in a portion of the liquid line of the system's refrigerant piping.

These and other objects of the invention, which will become apparent when the following description of the preferred embodiment, claims and drawing figures have been considered, are accomplished in an air conditioning system in which the liquid line portion of the refrigerant piping is caused to pass into and through the controls compartment of the outdoor portion of the system and is brought into a heat exchange relationship with the heat producing control components located within the compartment.

The present invention is particularly amenable for use in a central air conditioning system of the residential type which has an indoor heat exchanger and an outdoor cabinet section. The outdoor cabinet section houses, among other things, a variable speed compressor, a heat exchanger, refrigerant plumbing and piping, including a portion of the liquid line, a fan and system controls including components by which the speed of the compressor is controlled.

The speed of the compressor in such a system is controlled by an inverter which produces large quantities of heat in operation. In the air conditioning system of the present invention the liquid line portion of the refrigerant piping connecting the indoor and outdoor heat exchangers is routed into the compartment housing compressor speed control components and is formed into a serpentine shape therein.

Formed plates of material defining grooves which conform to the serpentine shape of the liquid line are tightly clamped over the serpentine portion of the liquid line to form an essentially solid block of material around the liquid line within the controls compartment. A thermal joint compound is used to fill any gaps which might otherwise be found to exist between the block of material and portion of the liquid line which passes through it. A path is thereby created for the transfer of heat between the assembled block of material and the refrigerant flowing through the liquid line within the controls compartment.

The plates of material forming the block through which the serpentine portion of the liquid line passes is configured to accept the mounting of power/control electronics in a fashion such that heat produced by the controls flows through their mountings and into the block of material which acts as a heat sink. In this manner, heat produced by the controls within the closed controls compartment of the outdoor cabinet is ultimately transferred to liquid refrigerant flowing therethrough and such heat is carried out of the controls section in the normal course of refrigerant flow through the system's liquid line.

Employment of the present invention results in surprising advantages which are neither readily apparent nor insignificant. For example, the temperature of refrigerant flowing through the liquid line of an air conditioning system is inherently higher than the temperature of the air, whether it be outdoor or indoor air, with which it has just undergone a heat exchange relationship in the heat exchanger acting as a condenser. That is, when a heat pump system is in the cooling or defrost modes of operation the outdoor heat exchanger acts as a condenser and the liquid line refrigerant temperature will be elevated with respect to outdoor ambient temperatures. In the space heating mode, liquid line refrigerant will be at a temperature which exceeds that of the space being heated and will under all foreseen circumstances of normal operation be higher than outdoor ambient temperatures which will be low enough to trigger a requirement for space heating. While always higher than outdoor ambient air temperatures, the temperature of liquid line refrigerant is relatively low in terms of the normal operating temperatures of the control components. Further, the temperature of such liquid line refrigerant is relatively stable during any given operating cycle since neither the temperatures of an indoor space nor of the outdoor ambient are likely to change with extreme rapidity.

Since the liquid line refrigerant temperature will in all cases be greater than the outdoor ambient air temperatures to which the control electronics are exposed it will be appreciated that under no circumstances will the control electronics be cooled by the liquid line refrigerant to an extent which would cause condensation to form on them in a reaction with the air found within the controls section of the outdoor cabinet. Further, since the liquid line refrigerant temperature is a very stable temperature in operation and is not, under normal operating conditions, subject to reaching extreme high or low temperatures relative to the normal operating temperatures of the compressor speed control components, the control components are not subject to thermal shock or stress by the cooling scheme of the present invention. This is extremely important from the standpoint of control component longevity and reliability.

Additionally, the present invention, which contemplates the use of liquid line refrigerant to cool control components, allows for the use of more compact cooling elements as compared to the physical size of the cooling elements which are required if air is employed as the controls cooling medium. Finally, the use of refrigerant in the liquid line of a dedicated cooling only or a heat pump air conditioning system to cool control electronics has been found to have an essentially negligible effect on the overall performance of such an air conditioning system.

DESCRIPTION OF THE PREFERRED EMBODIMENT

Figure 1:
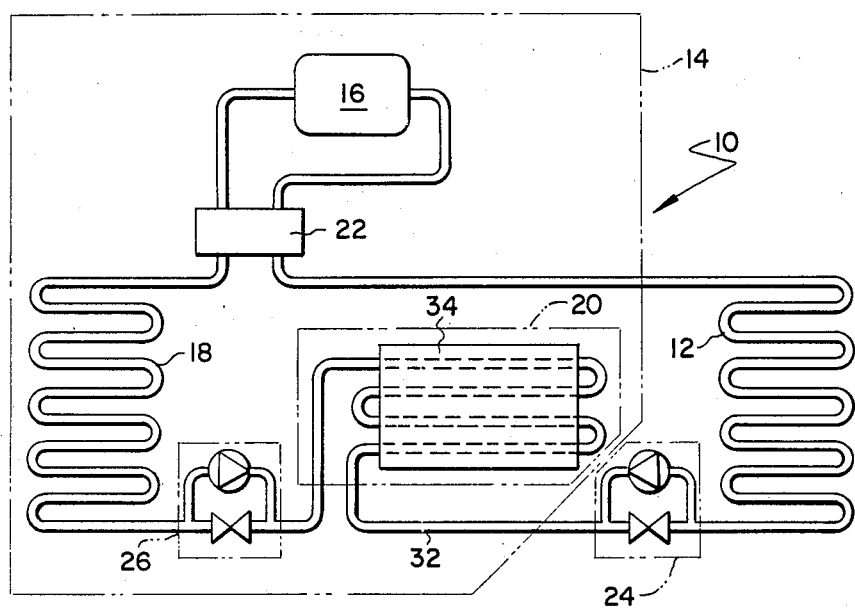
FIG. 1 is a schematic view of a heat pump system of the present invention.
Figure 2:
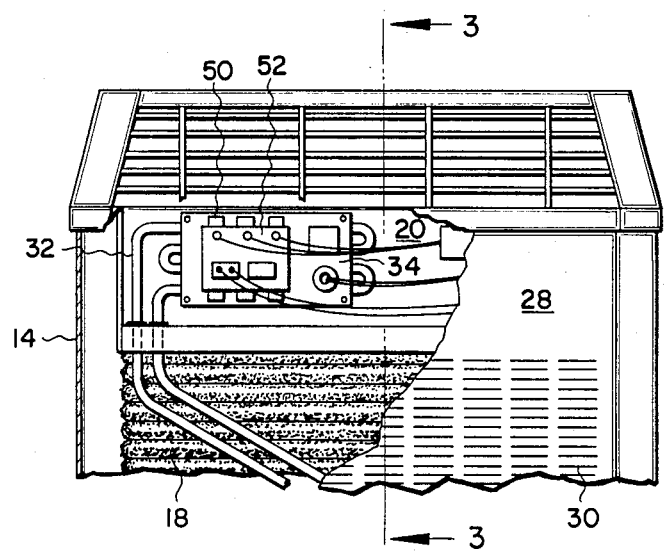
FIG. 2 is a side view of the outdoor cabinet section of the present invention in which a broken-away cabinet access panel is illustrated.
Figure 3:
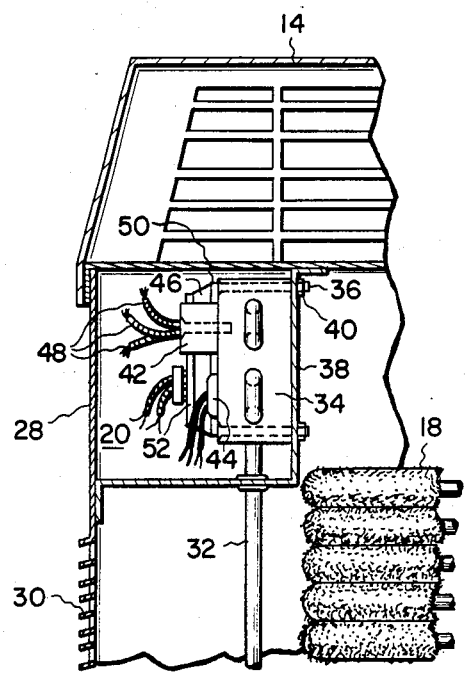
FIG. 3 is a view taken along lines 3—3 of FIG. 2.
Figure 4:
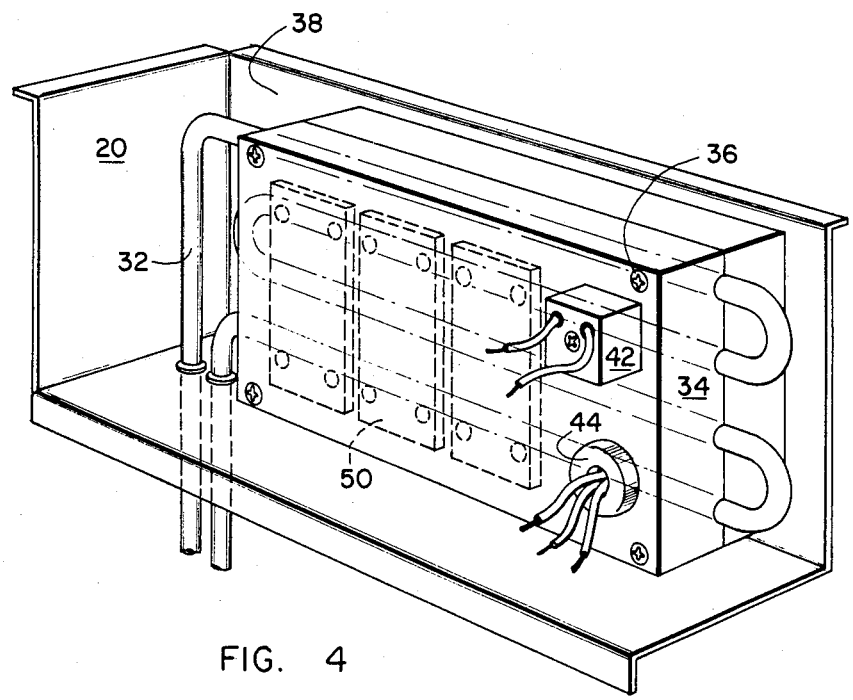
FIG. 4 is a perspective view of a portion of the controls compartment of the outdoor cabinet section of the present invention illustrating the apparatus by which heat is transferred from system controls compartment into refrigerant flowing through the liquid line portion of the refrigerant piping.

Schematically illustrated in FIG. 1 is the heat pump system of the present invention. System 10 is generally comprised of an indoor heat exchanger 12 and an outdoor cabinet section 14. Outdoor cabinet section 14 houses and/or defines a variable speed compressor 16, an outdoor heat exchanger 18, a controls compartment 20, in which various system controls are located, and a reversing valve 22 by which the flow of refrigerant through the system can be reversed in accordance with the mode of heat pump operation which is called for. It is contemplated in the present invention that compressor 16 is a true variable speed compressor, that is, its speed is controllable in a continuous fashion over a predetermined range of speeds. Outdoor cabinet section 14 also houses a fan and refrigerant piping and plumbing connections. Such piping includes piping which connects the suction and discharge ports of the compressor to the reversing valve and piping which connects the reversing valve to the indoor and outdoor heat exchangers.

In a tyical heat pump system the indoor and outdoor heat exchangers are connected for flow by refrigerant piping which has metering devices disposed in it that operate, when the refrigerant flow is in the appropriate direction, to meter refrigerant to the heat exchanger with which a particular metering device is associated. Each metering device is attached to or is in the immediate vicinity of the heat exchanger with which it is associated and is capable of being bypassed when the direction of refrigerant flow through the system is in a direction from the heat exchanger with which it is associated toward the metering device.

In FIG. 1, heat exchanger 12 has associated with it a combination metering/bypass valve 24 while outdoor heat exchanger 18 has associated with it a combination metering/bypass valve 26. The portion of the refrigerant piping which connects the metering/bypass valves in a heat pump system is referred to as the liquid line portion of the system. This is due to the fact that the refrigerant flowing through this section of piping when the system is operating can generally be characterized as a low temperature/high pressure liquid irrespective of the mode of system operation.

In a conventional heat pump system high temperature/high pressure refrigerant gas is discharged from the compressor and passes to the outdoor heat exchanger when the system is in the space cooling mode of operation. The refrigerant is condensed in the outdoor heat exchanger after having been brought into a heat exchange relationship with outdoor air. The condensed refrigerant flows out of the outdoor heat exchanger, bypasses the metering device associated with it and flows through the liquid line portion of the system to the metering/bypass device associated with the indoor heat exchanger. The refrigerant is then metered into the indoor heat exchanger where it vaporized as heat is transferred to it from the air within the indoor space.

In the space heating mode of operation, the direction of refrigerant flow through the system is reversed as are the functions of the indoor and outdoor heat exchangers. In the space heating mode the indoor heat exchanger functions as a condenser and while the outdoor heat exchanger functions as an evaporator. Nonetheless, the refrigerant flowing from the indoor heat exchanger to the metering/bypass device associated with the outdoor heat exchanger is in the liquid state having just passed through the indoor heat exchanger which operates, in the space heating mode, to condense the refrigerant pumped to it by the compressor.

Referring now to drawing FIGS. 1 through 4, controls compartment 20 in outdoor cabinet section 14 houses various control components, including heat producing power components which cooperate to control the speed of variable speed reciprocating compressor 16. Cabinet side panel 28, through which acccess is gained into the interior of outdoor cabinet section 14, includes a plurality of louvers 30 through which air is drawn into and through the outdoor heat exchanger 18. The upper portion of panel 28 is solid and overlies controls compartment 20 of the cabinet so as to protect the controls therein from the environment. The solid upper portion of panel 28 cooperates with the remainder of the outdoor cabinet section to define a closed, essentially sealed, compartment in which the system controls are housed.

In the heat pump system of the present invention, the employment of a variable speed compressor results in the need to employ power electronics components to control compressor speed. One such component is the compressor inverter drive which responds to a thermostat signal by increasing or decreasing the frequency of the current supplied to the compressor. Current frequency is in turn determinative of compressor motor speed and system capacity. Such power components inherently generate large amounts of heat which must be dissipated to prevent the malfunction of the system and its controls due to overheating.

It will be seen, from FIGS. 1 through 4, that in the heat pump system of the present invention a portion of the liquid line 32 is diverted into, passes through and exits controls compartment 20. The portion of liquid line 32 found within compartment 20 is preferably formed in a serpentine fashion. Clamped over this serpentine portion of liquid line 32 within the controls compartment is a block of material 34 which is preferably fabricated in two sections that cooperate to define a passage into which the serpentine portion of the liquid line can be tightly ensconced.

Block 34 is preferably fabricated from a material, such as aluminum, which is conducive to the transfer of heat. The effect of clamping the halves of the material block 34 tightly over the serpentine portion of the liquid line is to create an efficient path for the transfer of heat between block 34 and the refrigerant liquid line.

Block 34 is supported, in the preferred embodiment, within compartment 20 by bolts 36 which pass through block 34 and the back wall 38 of compartment 20 to which the bolts are secured by nuts 40. Typical of the heat producing components mounted on block 34 are rectifier 42 and thermal protective device 44. Device 44 is an optional protective component which senses the surface temperature of block 34 and which functions to disable the operation of compressor 16 when the temperature of block 34 exceeds a predetermined limiting temperature. The temperature sensed by device 44 is significant as it is directly indicative of the operating temperature of critical compressor speed control components mounted upon block 34. The reliability and life of inverter drive and other control components is to a significant degree dependent upon precluding such components from operating at high temperatures and/or precluding their exposure to thermal shock.

In addition to rectifier 42 and thermal protective switch 44, block 34 is configured to accept the mounting of modules 46 which include components by which the speed of compressor 16 is controlled. These components function with and are connected to the power leads 48 through which power is directed to compressor 16. It will be appreciated that in functioning to determine the characteristics of the power provided to the compressor, a large amount of heat is generated within the modules.

Modules 46 are attached, as by being bolted to block 34, in a manner which facilitates the transfer of heat between them and block 34. In this regard, modules 46 have mounting pads 50 which may be integral with the modules or which can be separately attached thereto. Pads 50 are bolted to block 34 and have a large planar surface through which heat is transferred from the modules into a cooperating planar surface of block 34. In the illustrated embodiment, modules 46 are attached to and are overlain by a circuit card 52 on which various other compressor speed control related components are mounted.

Tests have indicated that if the operating temperatures of critical compressor speed control components can be maintained at less than 160° F., the reliability and life of such components is dramatically enhanced. Operating temperatures of from 160° F.–180° F. reduce the reliability and life of such components significantly. Operating temperatures in excess of 180° F. for any extended period of time will typically result in failure of the control components. It has also been determined that under the most rigorous of normal operating conditions, the surface temperature of block 34 will not exceed a very acceptable 130° F., indicating that compressor speed control components are operating at temperatures well below acceptable upper limits. The most rigorous conditions were found to be those which exist when cooling is called for under conditions of high load and high outdoor ambient temperatures.

Even with the speed of the compressor, and therefore the mass flow of refrigerant through block 34, purposefully reduced under such conditions it was found that the surface temperature of block 34 stayed well within limits. Further, even under a worst case scenario, that being a loss of refrigerant charge under high load and high outdoor ambient temperature conditions, it was found that other system safety features such as a refrigerant low pressure cutout, operated to disable the compressor long before the temperature of block 34 entered the range in which the control electronics are adversely affected. This is significant from the standpoint that such controls are relatively expensive in terms of the overall cost of an air conditioning system. Their failure therefore necessarily results in a large repair expense.

It was also noted, in tests of controls cooling schemes wherein air was drawn over a heat exchange surface by the fan of an outdoor cabinet to dissipate control-generated heat, that normal compressor speed control operating temperatures were significantly elevated as compared to the normal operating temperature of refrigerant cooled controls. Further, such tests indicated that in the worst case failure scenario for air cooled systems, i.e., an outdoor fan failure at high load and high outdoor ambient temperature conditions, the failure of air cooled compressor drive controls is much more likely to occur, due to normal operating temperatures which are elevated in the first instance. Essentially, there is much less room for error in a controls cooling scheme which is predicated upon the cooling of controls components by ambient air.

In operation, when compressor 16, and therefore system 10 is energized, refrigerant is pumped from the compressor to either the indoor or outdoor heat exchangers within the system, depending upon the mode of system operation. The refrigerant will be initially pumped, whatever the mode of operation, to the heat exchanger which functions as a condenser. From the heat exchanger which functions as a condenser, the refrigerant is directed through the refrigerant liquid line 32 into controls compartment 20 of the outdoor cabinet.

The heat generated in the control and powering of compressor 16 within compartment 20 passes from modules 46 through pads 50 and into block 34, which acts as a heat sink due to the temperature differential between the heat generating modules and the refrigerant being pumped through the liquid line. Although the total amount of heat generated by modules 46 is not large, being on the order of from 100 to 300 watts at a maximum, such heat is generated in an extremely small area. Modules 46 have certain power electronics components potted into them. Modules 46 are therefore, in effect, insulators with respect to the heat generated by such internal components. The heat generated internal of modules 46 is concentrated in areas of on the order of 0.0625 square inches. It will be appreciated that such heat must efficiently be transported away from the compressor speed control components potted into the modules 46 to prevent their failure due to over-heating.

In the present invention such heat is conducted directly into pads 50 and thence into block 34. The generated heat then passes through any thermal joint compound it encounters and into the sidewalls of the liquid line, which may have an internally finned surface. The heat finally passes into the liquid refrigerant coursing through the liquid line. The refrigerant next carries the heat to and through the metering device associated with the heat exchanger acting as an evaporator.

The liquid line refrigerant is therefore employed, essentially in its normal course of flow through the system and in a manner which does not significantly affect system operation or efficiency, to carry heat away from the vicinity of the compressor controls and out of the compressor controls compartment. It is to be noted that the faster the speed of the compressor in operation, the greater is the mass of refrigerant which is pumped through block 34 in a given period of time. of time. The system is therefore self-regulating in that when the compressor is caused to be running at higher speeds due to increased load a greater quantity of refrigerant is pumped through the liquid line and is brought into a heat exchange relationship with the controls generating the heat.

Figure 5:
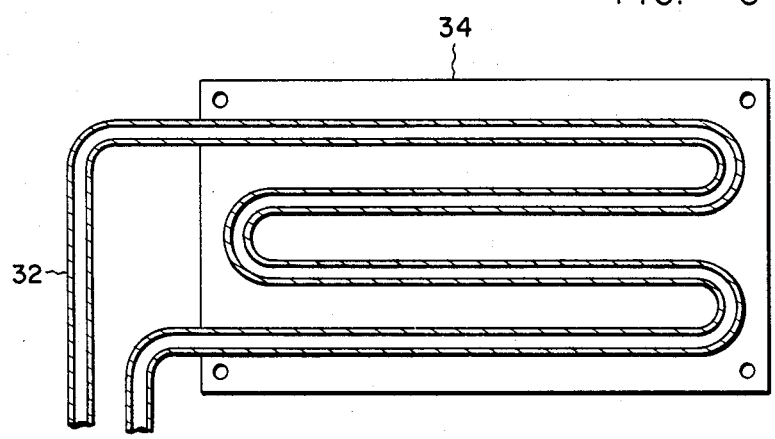
FIG. 5 is a cross-sectional view of a portion of the refrigerant liquid line of the heat pump system of FIG. 1 ensconced in one half of a two-piece block of material.
Figure 6:
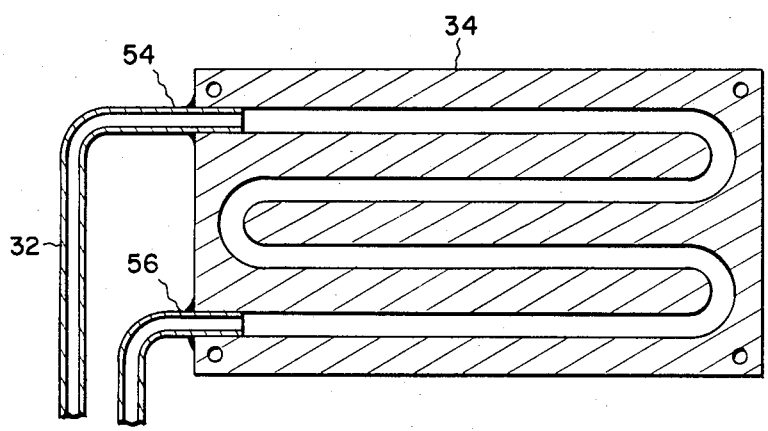
FIG. 6 is a cross-sectional view of another embodiment of the invention wherein a solid block of material defining a refrigerant flow passage is spliced into the refrigerant liquid line.

It will be appreciated that while the curved ends of the serpentine portion of the liquid line 32 are illustrated, in FIGS. 1 through 4, to be exposed within compartment 20 after block 34 is clamped over it, block 34 could be fabricated to define a cooperating serpentine passage such that none of the serpentine portion of the liquid line would be exposed within the controls compartment, as is illustrated in FIG. 5. It will further be appreciated that rather than running through the block of material 34, liquid line portion 32 could be interrupted and block 34 spliced into the liquid line so that system refrigerant flows through block 34 in direct contact with it as is illustrated in FIG. 6. In the instance of splicing block 34 into the liquid line 32 it will be appreciated that block 34 might be a unitary piece into which a flow passage has been cast. The interrupted ends 54 and 56 of the liquid line would then be brazed into the passage orifices of block 34.

Figure 7:
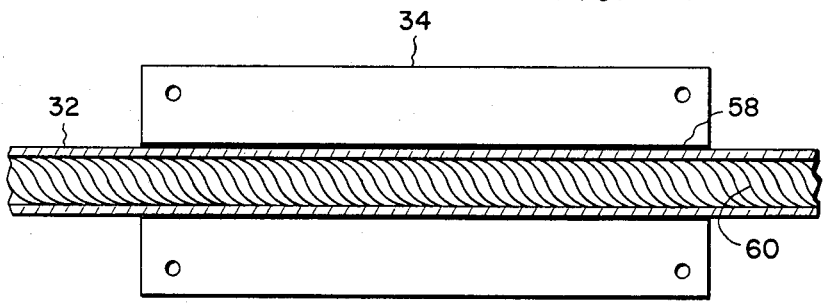
FIG. 7 is a cross-sectional view of a single pass embodiment of the invention.

Other variations in the configuration of block 34 are contemplated and are considered to be within the scope of this invention. For instance, liquid refrigerant or refrigerant liquid line 32 might pass through block 34 unidirectionally and/or in a single pass, as is illustrated in FIG. 7. Also illustrated in FIG. 7 is the employment of thermal joint compound 58 to seal any gap which might be found to exist between block 34 and the portion of liquid line running through it. FIG. 7 further illustrates the employment of internal finning 60 in the liquid line which passes through block 34.

It will also be appreciated that the present invention is equally applicable to cooling only air conditioning applications wherein the flow of refrigerant is in all cases from the compressor to the outdoor heat exchanger coil. Finally, although residential and light commercial air conditioning systems almost universally employ reciprocating compressors at the time of this writing, the use of rotary compressors of many types is on the near horizon and their use is contemplated as being within the scope of this invention. Still other variations are contemplated which do not depart from the spirit of this invention and therefore its scope is intended to be limited only in accordance with the language of the claims which follow.

What is claimed is:

1. An air conditioning system comprising:
   an outdoor section;
   a heat exchanger disposed in said outdoor section;
   a second heat exchanger, said second heat exchanger being connected to said first heat exchanger by a refrigerant liquid line;
   a variable speed compressor disposed in said outdoor section;
   means for delivering refrigerant from said compressor to one of said first and said second heat exchangers;
   means for controlling the speed of said compressor over a predetermined continuous range of speeds; and
   means for transferring heat from said means for controlling into refrigerant in said liquid line.

2. The system according to claim 1 wherein said outdoor section defines a controls compartment in which said means for controlling are disposed and wherein the mass-flow rate of refrigerant through said liquid line is in proportion with the speed of said compressor, the mass flow of refrigerant through said liquid line being sufficient, whenever said compressor is operating within said predetermined continuous range of speeds, to maintain said means for controlling at an operating temperature of less than 180° F. within said controls compartment.

3. The system according to claim 2 wherein said outdoor section defines a controls compartment in which said means for controlling and said means for transferring are disposed and wherein said liquid line passes into and out of said controls compartment.

4. The system according to claim 3 wherein said means for transferring heat comprises a block of material conducive to the transfer of heat, said block of material adjoining both said means for controlling and said liquid line so that a path for the transfer of heat is established between said means for controlling and refrigerant within said liquid line.

5. The system according to claim 4 wherein said liquid line includes a serpentine section located in said controls compartment and wherein said block of material defines a passage through which at least a portion of said serpentine section of said liquid line passes.

6. The system according to claim 5 wherein the internal wall surface of at least some of said serpentine portion of said liquid line is finned.

7. The system according to claim 5 wherein said block of material is a two-piece block of material clamped over said serpentine section of said liquid line.

8. The system according to claim 5 wherein said means for controlling is mounted on a surface of said block of material.

9. The system according to claim 8 wherein said means for controlling includes means defining a surface which abuts a cooperating surface on said block of material so that heat transfer from said means for controlling to said block of material is enhanced.

10. An air conditioning outdoor section comprising:
    a cabinet, said cabinet defining a controls compartment;
    a compressor, the speed of said compressor being controllable over a continuous range of speeds;
    means, including an inverter, for controlling the speed of said compressor, said speed controlling means being disposed in said controls compartment of said cabinet;
    a heat exchanger connected for refrigerant flow with said compressor;
    refrigerant piping connected for refrigerant flow with said heat exchanger; and
    a heat sink attached to both said speed controlling means and to a portion of said refrigerant piping so that a path for the transfer of heat is established between said speed controlling means and refrigerant in said refrigerant piping.

11. The outdoor section according to claim 10 wherein said heat sink is located in said controls compartment and wherein the portion of said refrigerant piping to which said heat sink is attached is located in said controls compartment, said compressor pumping sufficient refrigerant to said heat exchanger and through said heat sink, whenever said compressor is operating to maintain said inverter at an operating temperature of less than 180° F.

12. The outdoor section according to claim 11 wherein said heat sink is a two-piece block of material clamped over said portion of refrigerant piping.

13. The outdoor section according to claim 12 wherein said portion of refrigerant piping located in said controls compartment is formed into a serpentine shape and wherein said block of material defines a passage accommodating the passage of said portion of refrigerant piping therethrough.

14. The outdoor section according to claim 13 wherein said means for controlling includes a plurality of modules, each of said modules being attached to a planar face of said block of material in a heat exchange relationship therewith.

15. The outdoor section according to claim 14 wherein each of said modules includes a planar pad, said pad being attached to said block of material so that said planar pads are in contact with said planar face of said block of material.

16. A method of cooling compressor speed control components in an air conditioning system which includes first and second heat exchangers and a compressor the speed of which is variable over a continuous range of speeds in accordance with the characteristics of the power delivered to it from the speed control components, comprising the steps of:
 connecting said compressor for refrigerant flow with said first and said second heat exchangers;
 connecting said first and said second heat exchangers with a refrigerant liquid line;
 cooling refrigerant discharged from said compressor by condensing it in one of said first and said second heat exchangers;
 passing said cooled refrigerant from the heat exchanger in which it is condensed to the other heat exchanger through said liquid line; and
 establishing a path for the transfer of heat from said speed control components to refrigerant in said liquid line.

17. The method according to claim 16 further comprising the steps of routing said liquid line into the vicinity of said speed control components and attaching a heat sink to both said speed control components and to said liquid line.

18. The method according to claim 17 wherein said establishing step includes the step of passing said liquid line through said heat sink.

19. The method according to claim 17 further comprising the step of configuring the portion of the liquid line in the vicinity of the speed control components in a serpentine shape and wherein said attaching step includes the step of clamping at least a majority of said serpentine portion of said liquid line within said heat sink.

20. The method according to claim 17 wherein said passing step includes the step of pumping sufficient refrigerant from the condensing heat exchanger, whenever said compressor is operating, into a heat exchange relationship with said heat sink so as to maintain the operating temperature of said speed control components less than 180° F.

* * * * *